US012750964B2

(12) United States Patent
Kim et al.

(10) Patent No.: US 12,750,964 B2
(45) Date of Patent: Sep. 29, 2026

(54) METHOD OF MANUFACTURING A DISPLAY MODULE

(71) Applicant: Samsung Display Co., Ltd., Yongin-Si (KR)

(72) Inventors: Donghwan Kim, Yongin-si (KR); Changmoo Lee, Yongin-si (KR); Youngdo Kim, Yongin-si (KR); Junwoo You, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 116 days.

(21) Appl. No.: 18/942,775

(22) Filed: Nov. 11, 2024

(65) Prior Publication Data

US 2025/0338416 A1 Oct. 30, 2025

(30) Foreign Application Priority Data

Apr. 26, 2024 (KR) ........................ 10-2024-0055880

(51) Int. Cl.

| | |
|---|---|
| ***H05K 5/03*** | (2006.01) |
| *B41F 15/08* | (2006.01) |
| *B41F 15/36* | (2006.01) |
| *B41M 1/12* | (2006.01) |
| *B41M 1/26* | (2006.01) |
| *H10K 59/80* | (2023.01) |
| *H10K 71/13* | (2023.01) |
| *H10K 71/40* | (2023.01) |
| *H10K 102/00* | (2023.01) |

(52) U.S. Cl.

CPC ............ *H05K 5/03* (2013.01); *B41F 15/0818* (2013.01); *B41F 15/36* (2013.01); *B41M 1/12* (2013.01); *B41M 1/26* (2013.01); *H10K 59/87* (2023.02); *H10K 59/8794* (2023.02); *H10K 71/13* (2023.02); *H10K 71/40* (2023.02); *H10K 2102/351* (2023.02); *H10K 2102/361* (2023.02)

(58) Field of Classification Search

CPC ............... H05K 5/03; H10K 2102/351; H10K 2102/361; H10K 59/1201; H10K 59/87; H10K 59/8794; H10K 71/13; H10K 71/40; B41F 15/0818; B41F 15/36; B41M 1/12; B41M 1/26

USPC .................................................. 427/272, 282

See application file for complete search history.

(56) References Cited

U.S. PATENT DOCUMENTS

| | | | | |
|---|---|---|---|---|
| 11,604,415 | B2 | 3/2023 | Yamauchi et al. | |
| 11,951,722 | B2 * | 4/2024 | Hwang | G02F 1/133331 |
| 2010/0245705 | A1 * | 9/2010 | Nakagawa | G02F 1/133308 349/58 |

(Continued)

FOREIGN PATENT DOCUMENTS

| | | | |
|---|---|---|---|
| CN | 217655525 | U | 10/2022 |
| JP | 2020-180216 | A | 11/2020 |

(Continued)

*Primary Examiner* — Brian K Talbot

(74) *Attorney, Agent, or Firm* — Innovation Counsel LLP

(57) ABSTRACT

A manufacturing method of a display module includes applying a coating solution to a rear surface of a display panel using a screen printing process, semi-curing the coating solution at a first temperature to form a preliminary cover panel, and pressing the preliminary cover panel at a second temperature to form a cover panel. A number of pores in the preliminary cover panel may be greater than a number of pores in the cover panel.

20 Claims, 9 Drawing Sheets

(56) References Cited

U.S. PATENT DOCUMENTS

| | | | | |
|---|---|---|---|---|
| 2020/0084897 | A1* | 3/2020 | Shin | H05K 1/147 |
| 2022/0396064 | A1* | 12/2022 | Kim | H10K 71/50 |
| 2023/0280507 | A1 | 9/2023 | Kim et al. | |
| 2023/0393629 | A1 | 12/2023 | Jung et al. | |
| 2024/0057439 | A1* | 2/2024 | Lee | H10K 59/65 |
| 2024/0190125 | A1* | 6/2024 | Lee | B41F 15/34 |
| 2024/0281036 | A1* | 8/2024 | Lee | G06F 1/1656 |
| 2024/0381558 | A1* | 11/2024 | Kim | H05K 5/03 |
| 2025/0089522 | A1* | 3/2025 | Jung | H10K 59/872 |

FOREIGN PATENT DOCUMENTS

| | | | | | |
|---|---|---|---|---|---|
| KR | 20110048319 | A | * | 5/2011 | H10K 71/00 |
| KR | 10-1635812 | B1 | | 7/2016 | |
| KR | 10-1859723 | B1 | | 5/2018 | |
| KR | 10-2021-0014121 | A | | 2/2021 | |
| KR | 10-2023-0130196 | A | | 9/2023 | |
| KR | 10-2023-0167771 | A | | 12/2023 | |

* cited by examiner

METHOD OF MANUFACTURING A DISPLAY MODULE

CROSS-REFERENCE TO RELATED APPLICATION(S)

This application claims priority to and the benefit of Korean Patent Application No. 10-2024-0055880, filed on Apr. 26, 2024 in the Korean Intellectual Property Office, the disclosure of which is incorporated by reference herein in its entirety.

BACKGROUND

1. Field

The present disclosure relates to a method of manufacturing a display module. More particularly, the present disclosure relates to a method of manufacturing a display module including a display panel of which a coating process is directly applied to a rear surface.

2. Description of Related Art

Multimedia electronic devices, such as televisions, mobile phones, tablet computers, navigation devices, and game devices, include a display panel to display an image and electronic parts to perform various functions.

A cover panel that protects the display panel and the electronic parts has been actively developed to maintain reliability of the display panel and the electronic parts included in the electronic devices.

SUMMARY

The present disclosure provides a method of manufacturing a display module with improved reliability.

According to an embodiment, a method of manufacturing a display module includes applying a coating solution to a rear surface of a display panel using a screen printing process, semi-curing the coating solution at a first temperature to form a preliminary cover panel, and pressing the preliminary cover panel at a second temperature to form a cover panel.

The first temperature may be equal to or greater than about 70° C. and equal to or smaller than about 100° C., and the second temperature may be equal to or greater than about 70° C. and equal to or smaller than about 100° C. A number of pores in the preliminary cover panel may be greater than a number of pores in the cover panel.

A time for forming the preliminary cover panel may be equal to or greater than about 10 minutes and equal to or smaller than about 20 minutes.

A time for forming the cover panel may be equal to or greater than about 10 minutes and equal to or smaller than about 20 minutes.

The display panel may include a display area and a non-display area adjacent to the display area.

The coating solution may be disposed on an entire area of the rear surface of the display panel overlapping the display area and a portion of an area of the rear surface of the display panel overlapping the non-display area.

The cover panel may have a thickness equal to or greater than about 100 micrometers and equal to or smaller than about 200 micrometers.

The cover panel may have a horizontal thermal conductivity equal to or greater than about 70 W/mK and equal to or smaller than about 130 W/mK.

A pressure applied to the cover panel during the forming of the cover panel may be equal to or greater than about 10 bar and equal to or smaller than about 20 bar.

The screen printing process may include placing a mesh mask or a metal open mask.

The coating solution may have a viscosity equal to or greater than about 100 cps and equal to or smaller than about 900 cps.

The coating solution may include a binder, a filler mixed with and dispersed in the binder, and a solvent.

A portion of the solvent of the coating solution may be evaporated during the forming of the preliminary cover panel.

The binder may include an epoxy resin or a silicon resin, which is in a liquid state.

The filler may include a graphite filler or a metallic filler.

The cover panel may have a single-layer structure.

The cover panel may be in direct contact with the rear surface of the display panel.

The cover panel may have a thickness smaller than a thickness of the preliminary cover panel.

The cover panel may have a density greater than a density of the preliminary cover panel.

The cover panel may have a viscosity greater than a viscosity of the preliminary cover panel.

The forming of the preliminary cover panel may include placing the display panel on which the coating solution is applied inside a first chamber.

The forming of the cover panel may include placing the display panel on which the preliminary cover panel is formed inside a second chamber.

Non-uniform pores may be formed in the preliminary cover panel during the forming of the preliminary cover panel.

At least one of the pores may be removed during the forming of the cover panel.

According to an embodiment, a method of manufacturing a display module includes applying a coating solution to a rear surface of a display panel using a screen printing process, semi-curing the coating solution at a first temperature to form a preliminary cover panel on the rear surface of the display panel, and decompressing the preliminary cover panel at a second temperature to form a cover panel.

The first temperature may be equal to or greater than about 70° C. and equal to or smaller than about 100° C.

The second temperature may be equal to or greater than about 70° C. and equal to or smaller than about 100° C.

The decompressed state may be a vacuum state.

A number of pores in the preliminary cover panel may be greater than a number of pores in the cover panel.

A time for forming the preliminary cover panel may be equal to or greater than about 10 minutes and equal to or smaller than about 20 minutes.

A time for forming the cover panel may be equal to or greater than about 10 minutes and equal to or smaller than about 20 minutes.

The forming of the cover panel may include placing the display panel on which the preliminary cover panel is disposed inside a decompression chamber and discharging an air in the decompression chamber to an outside of the decompression chamber to maintain the decompression state.

A display module manufactured through the manufacturing method according to the present disclosure has improved heat dissipation function and reduced thickness.

BRIEF DESCRIPTION OF THE DRAWINGS

The above and other features of the present disclosure will become readily apparent with reference to the following descriptions taken in conjunction with the accompanying drawings.

DETAILED DESCRIPTION

Figure 1:
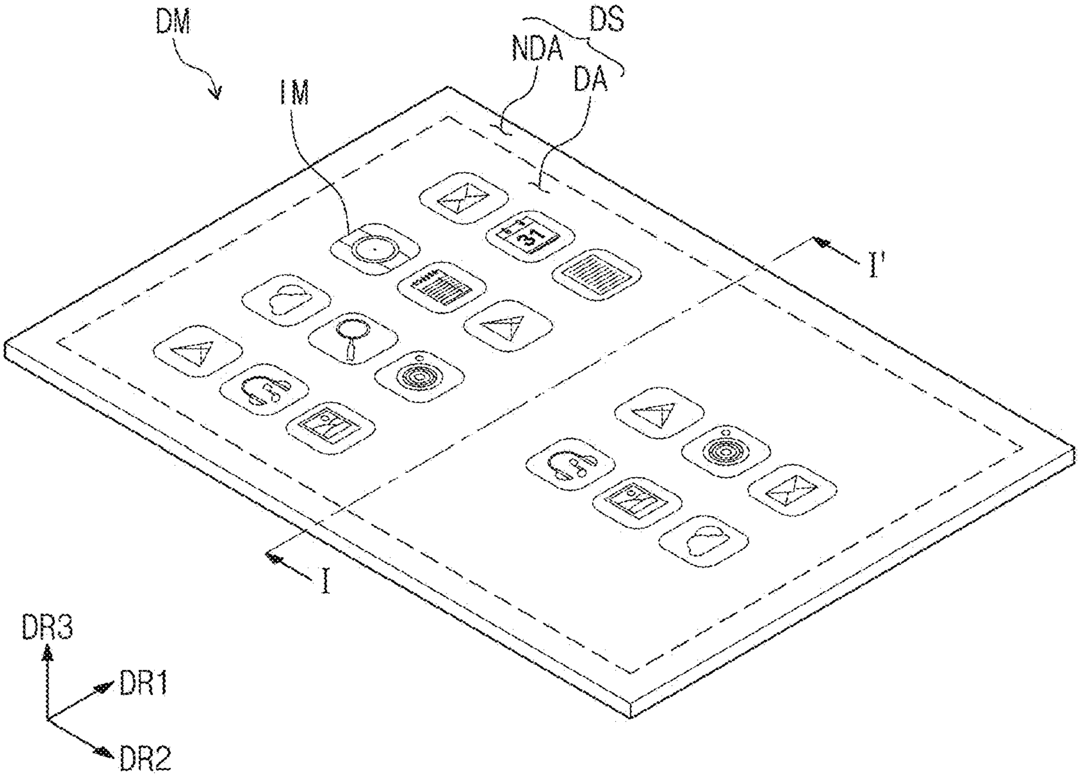
FIG. 1 is a perspective view of a display module according to an embodiment of the present disclosure.

The present disclosure may be variously modified and realized in many different forms, and thus specific embodiments will be exemplified in the drawings and described in detail hereinbelow. However, the present disclosure should not be limited to the exemplified drawings and relevant descriptions thereof, and be construed to include all modifications, equivalents, or replacements included in the spirit and the scope of the present disclosure.

In the present disclosure, it will be understood that when an element (or area, layer, or portion) is referred to as being "on", "connected to" or "coupled to" another element or layer, it can be directly on, connected or coupled to the other element or layer, or intervening elements or layers may be present.

Like numerals refer to like elements throughout. In the drawings, the thickness, ratio, and dimension of components are exaggerated for effective description of the present disclosure. As used herein, the term "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B."

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe a relationship of elements illustrated in the drawings. These terms represent relative concepts and are described based on directions illustrated in the drawings.

It will be further understood that the terms "include" or "including", when used in this specification, specify the presence of stated features, integers, steps, operations, elements, or components, but do not preclude the presence or addition of one or more other features, integers, steps, operations, elements, components, or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to accompanying drawings.

Figure 2:
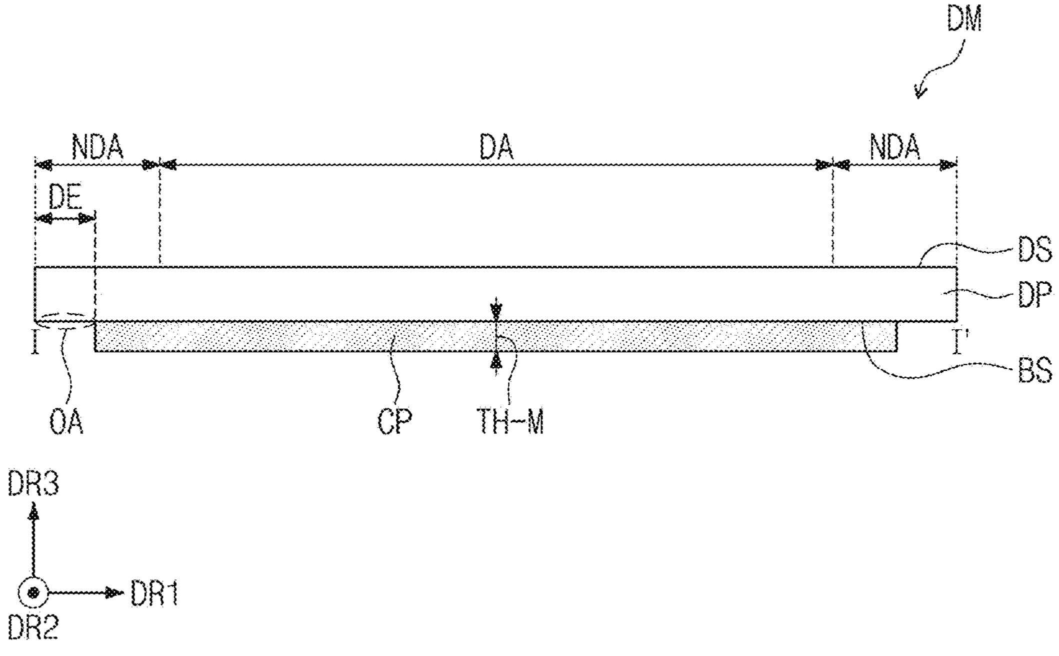
FIG. 2 is a cross-sectional view of a display module taken along a line I-I' of FIG. 1.

FIG. 1 is a perspective view of a display module DM according to an embodiment of the present disclosure. FIG. 2 is a cross-sectional view of the display module DM taken along a line I-I' of FIG. 1.

The display module DM may be activated in response to electrical signals. The display module DM may include various embodiments. As an example, the display module DM may be applied not only to a large-sized electronic item, such as a television, an outdoor billboard, etc., but also to a small and medium-sized electronic item, such as a mobile phone, a tablet computer, a navigation unit, a game unit, etc. However, these are merely examples, and the display module DM may be applied to other electronic devices as long as they do not depart from the inventive concept of the present disclosure.

The display module DM may be flexible. The term "flexible" used herein refers to the property that allows bending and may include structures ranging from those that are completely folded to those that bend at the scale of a few nanometers. For example, the display module DM may be a curved display module or a foldable display module. The present disclosure is not limited thereto, and the display module DM may be rigid.

The display module DM may include a display surface DS to display an image IM through to a front surface thereof. The display module DM may display the image IM through the display surface DS, which is substantially parallel to a plane defined by a first direction DR1 and a second direction DR2, toward a third direction DR3. The third direction DR3 may intersect each of the first direction DR1 and the second direction DR2, and a normal line direction of the display surface DS may be substantially parallel to the third direction DR3. The image IM displayed through the display surface DS may include a still image as well as a moving image.

The display surface DS may include a display area DA and a non-display area NDA. The display area DA may provide the image IM, and the non-display area NDA may not provide the image IM. The non-display area NDA may be disposed adjacent to the display area DA. As an example, the non-display area NDA may surround the display area DA, however, the present disclosure should not be limited thereto. For instance, the non-display area NDA may be located adjacent to only one side of the display area DA.

In the present disclosure, a front (or upper) surface and a rear (or lower) surface of each component of the display module DM may be defined with respect to a direction in which the image IM is displayed. The front and rear surfaces may be opposite to each other in the third direction DR3. Directions indicated by the first, second, and third directions DR1, DR2, and DR3 are relative to each other, and thus, the directions indicated by the first, second, and third directions DR1, DR2, and DR3 may be changed to other directions.

Referring to FIG. 2, the display module DM may include a display panel DP and a cover panel CP.

The display panel DP may display the image IM (refer to FIG. 1) in response to electrical signals. The display panel DP according to an embodiment may be a light emitting display panel, however, it should not be particularly limited thereto. For example, the display panel DP may be an organic light emitting display panel, an inorganic light emitting display panel, or a quantum-dot light emitting display panel.

Although not shown in FIG. 2, the display panel DP may include a base layer, a circuit element layer disposed on the base layer and including at least one transistor, a display element layer including a light emitting element connected to the transistor, and an encapsulation layer covering the display element layer. In addition, the display panel DP may further include a panel protective layer disposed on a lower surface of the base layer.

The display panel DP may include a display area and a peripheral area, which correspond to the display area DA and the non-display area NDA of the display module DM described with reference to FIG. 1, respectively. Hereinafter, the display area and the peripheral area are assigned with the same reference numerals as those of the display area DA and the non-display area NDA of the display module DM.

As pixels (not shown) are arranged in the display area DA of the display panel DP and the pixels (not shown) emit lights in response to electrical signals, the display panel DP may display the image IM (refer to FIG. 1) in the display area DA.

The non-display area NDA may be disposed adjacent to the display area DA. As an example, the non-display area NDA may surround the display area DA when viewed in the plane. A driving circuit or a driving line may be disposed in the non-display area NDA to drive the pixels (not shown) arranged in the display area DA.

The cover panel CP may be disposed on a rear surface BS of the display panel DP. The cover panel CP may have a single-layer structure. The cover panel CP may be disposed directly on the rear surface BS of the display panel DP.

The cover panel CP may perform one of several functions, such as a heat dissipation function that dissipates a heat generated from the display panel DP, a light blocking function that blocks a light directed toward the rear surface BS of the display panel DP or emitted from the display panel DP, an electromagnetic blocking function that blocks an electromagnetic interference (EMI) directed to the display panel DP, and a cushioning function that protects the display panel DP from external impacts.

The cover panel CP may not be disposed in a portion of the rear surface BS of the display panel DP, which is adjacent to an edge of the display panel DP. The portion of the rear surface BS of the display panel DP, which is not provided with the cover panel CP, may be referred to as an outer area OA. When viewed in a cross-section, the outer area OA may have an outer width DE. The outer area OA may correspond to a portion where a coating solution RG (refer to FIG. 5) is not applied during a screen printing process, which will be described later.

A conventional display module had multiple functional layers to cushion external impacts that may be transmitted to a display panel, to block a light directed toward the display panel, to block an electromagnetic interference, and to dissipate a heat from the display panel. However, when multiple layers having the above functions are formed, a manufacturing method of the display module becomes complicated, and a thickness of the display module becomes larger.

On the other hand, according to a manufacturing method of the display module, the cover panel CP may be directly formed on the rear surface BS of the display panel DP. That is, by increasing a packing density of the cover panel CP, the heat dissipation function may be improved, and the manufacturing method for a thinner display module DM may be provided. Accordingly, the display module DM that includes a "directed-coated cover panel (DCCP)" with improved heat dissipation function may be provided without causing cracks in the display panel DP. Hereinafter, the manufacturing method of the display module will be described in detail with reference to drawings.

Figure 3:
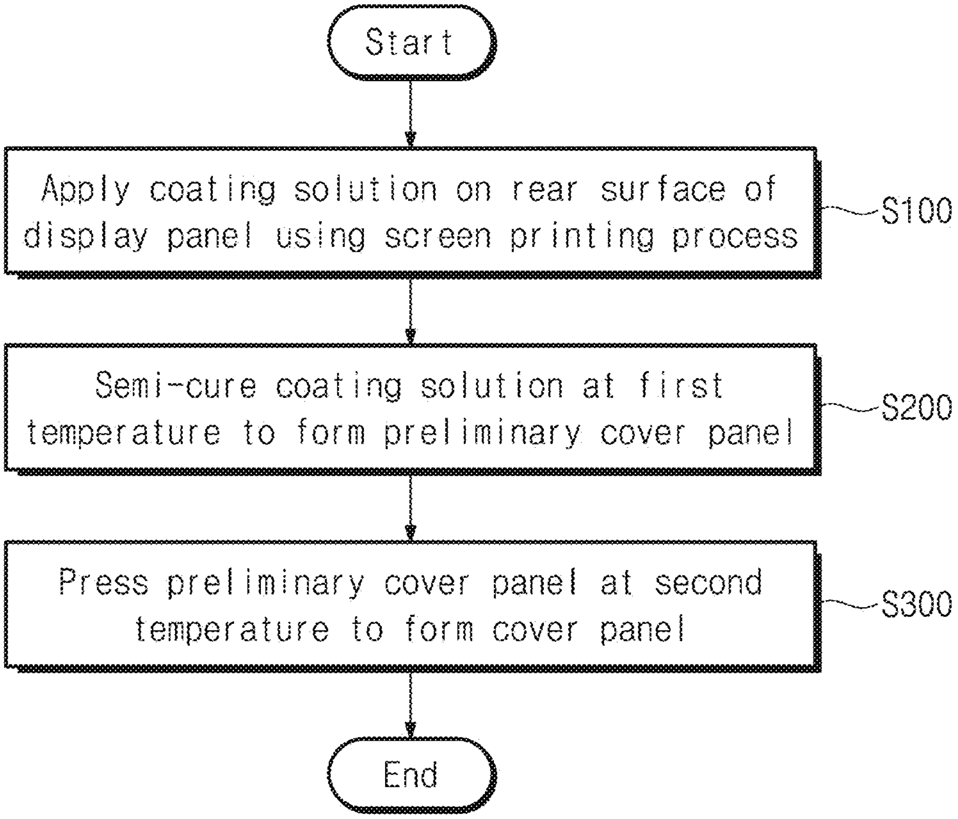
FIG. 3 is a flowchart illustrating a method of manufacturing a display module according to an embodiment of the present disclosure.

FIG. 3 is a flowchart illustrating the method of manufacturing the display module according to an embodiment of the present disclosure.

The manufacturing method of the display module may include applying a coating solution on the rear surface of the display panel using the screen printing process (S100), semi-curing the coating solution at a first temperature to form a preliminary cover panel (S200), and pressing the preliminary cover panel at a second temperature to form the cover panel (S300).

In the present disclosure, a step of forming the preliminary cover panel (S200) may be referred to as a "first forming process", and a step of forming the cover panel (S300) may be referred to as a "second forming process".

Figure 4:
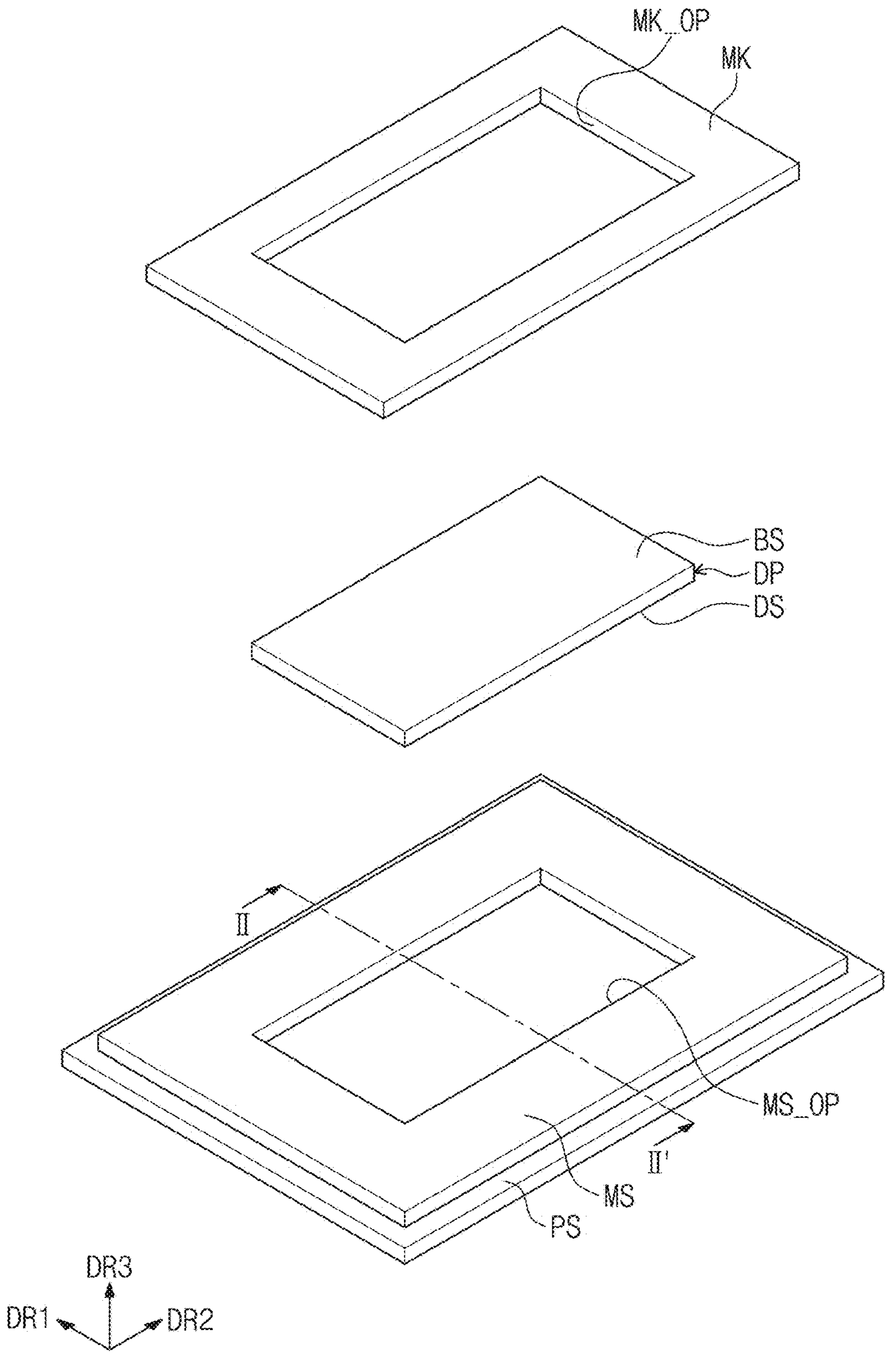
FIG. 4 is an exploded perspective view illustrating a relationship between a mask MK, a display panel DP, a mask stage MS, and a panel stage PS used in a step of applying a coating solution, according to an embodiment of the present disclosure.
Figure 5:
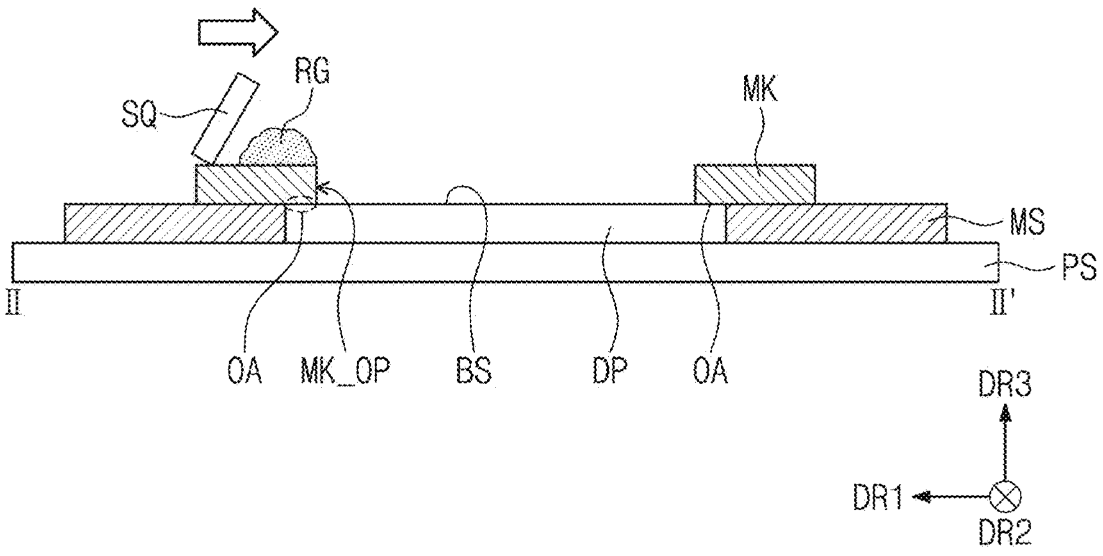
FIG. 5 is a cross-sectional view taken along a line II-II' of FIG. 4 to illustrate a relationship between a mask MK, a display panel DP, a mask stage MS and a panel stage PS.
Figure 6:
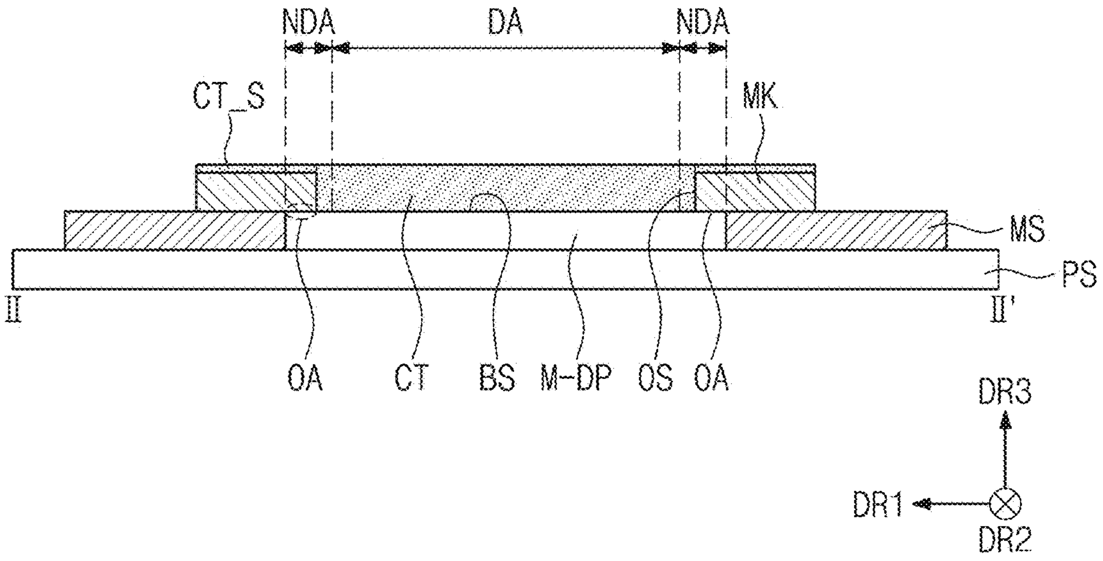
FIG. 6 is a cross-sectional view illustrating a display panel DP after a coating solution RG being applied to a rear surface BS of the display panel DP.

FIGS. 4 to 6 are views illustrating steps of applying the coating solution (S100) according to an embodiment of the present disclosure.

The display panel DP shown in FIGS. 4 to 6 is arranged in an inverted form compared to the display panel DP described with reference to FIG. 2. In other words, in order to apply the coating solution RG (refer to FIG. 5) to the rear surface BS of the display panel DP, the rear surface BS of the display panel DP may be positioned to face the third direction DR3.

FIG. 4 is an exploded perspective view illustrating a relationship between a mask MK, a display panel DP, a mask stage MS, and a panel stage PS used in a step of applying a coating solution, according to an embodiment of the present disclosure. FIG. 5 is a cross-sectional view taken along a line II-II' of FIG. 4 to illustrate a relationship between a mask MK, a display panel DP, a mask stage MS and a panel stage PS. FIG. 6 is a cross-sectional view illustrating a display panel DP after a coating solution RG being applied to the rear surface BS of the display panel DP.

Hereinafter, a step of applying the coating solution (S100) according to the present embodiment will be described with reference to FIGS. 4 to 6.

The panel stage PS may have a flat-plate shape on which the mask stage MS, the display panel DP, and the mask MK are disposed during the step of applying the coating solution (S100). The panel stage PS may provide a base surface on which the mask stage MS, the display panel DP, and the mask MK are disposed.

The mask stage MS may be disposed on the panel stage PS. The mask stage MS may have a flat upper surface. The mask stage MS may have a stage opening MS_OP defined therethrough to accommodate the display panel DP. When the display panel DP is placed inside the stage opening MS_OP, the display panel DP may be prevented from moving in the first direction DR1 and the second direction DR2 on the panel stage PS during the step of applying the coating solution (S100). Accordingly, reliability of the screen printing process described later may be improved.

The display panel DP may be disposed in the stage opening MS_OP extending through the mask stage MS. An upper surface DS of the display panel DP may face the panel stage PS, and the rear surface BS of the display panel DP may be placed to face the mask MK.

According to an embodiment, the display panel DP may be provided in the form of a mother substrate, and the display module DM (refer to FIG. 1) may be formed by cutting the mother substrate on which the cover panel is disposed through the subsequent processes.

The mask MK may be disposed on the display panel DP and the mask stage MS. The mask MK may have a mask opening MK_OP defined therethrough along the third direction DR3. As an example, the mask MK may be an open mask containing a metal material. However, the mask MK should not be limited thereto as long as the mask MK may be used in the screen printing process. As an example, the mask MK may be a mesh mask for the screen printing process.

Referring to FIG. 5, a squeezer SQ may be positioned on one side of an upper surface of the mask MK. The squeezer SQ may move on the upper surface of the mask MK in the first direction DR1, the second direction DR2, or a direction between the first direction DR1 and the second direction DR2 on the upper surface of the mask MK to introduce the coating solution RG into the mask opening MK_OP. Accordingly, the coating solution RG may be applied to the rear surface BS of the display panel DP.

The coating solution RG may be a viscous solution used in the screen printing process. As an example, the coating solution RG may have a viscosity of about 100 cps or more and about 900 cps or less. The coating solution RG may include a mixed solution SL (refer to FIG. 8), which is obtained by mixing a binder with a solvent, and a filler (refer to FIG. 8). This will be described in detail with reference to FIG. 8.

The mask MK may overlap the edge of the display panel DP. A portion of the rear surface BS of the display panel DP on which the mask MK is disposed may be referred to as the outer area OA. Since the outer area OA is covered by the mask MK, the coating solution RG may not be applied to the outer area OA in the screen printing process. As an example, an area within about 3 mm from the edge of the rear surface BS of the display panel DP may be covered by mask MK.

Referring to FIG. 6, a coating layer CT may be formed by the coating solution RG (refer to FIG. 5) applied to the rear surface BS of the display panel DP. The coating layer CT may be in direct contact with the rear surface BS of the display panel DP. The coating layer CT may have a single-layer structure formed by applying the coating solution RG (refer to FIG. 5).

The coating layer CT may overlap the display area DA of the rear surface BS of the display panel DP and a portion of the non-display area NDA. The coating layer CT may not be formed in the outer area OA on the rear surface BS of the display panel DP.

The coating layer CT may become the preliminary cover panel P-CP (refer to FIG. 9) through a heating process, and may become the cover panel CP (refer to FIG. 10) through a pressing and heating process.

The coating solution RG (refer to FIG. 5) may be applied to the upper surface of the mask MK and a residual coating layer CT_S may be formed. The residual coating layer CT_S may be cut parallel to a side surface OS of the mask MK, which defines the mask opening MK_OP (refer to FIG. 5), and separated from the coating layer CT. Although not shown in drawings, the residual coating layer CT_S may be removed from the mask MK by a separate cleaning process performed on the mask MK.

Figure 7:
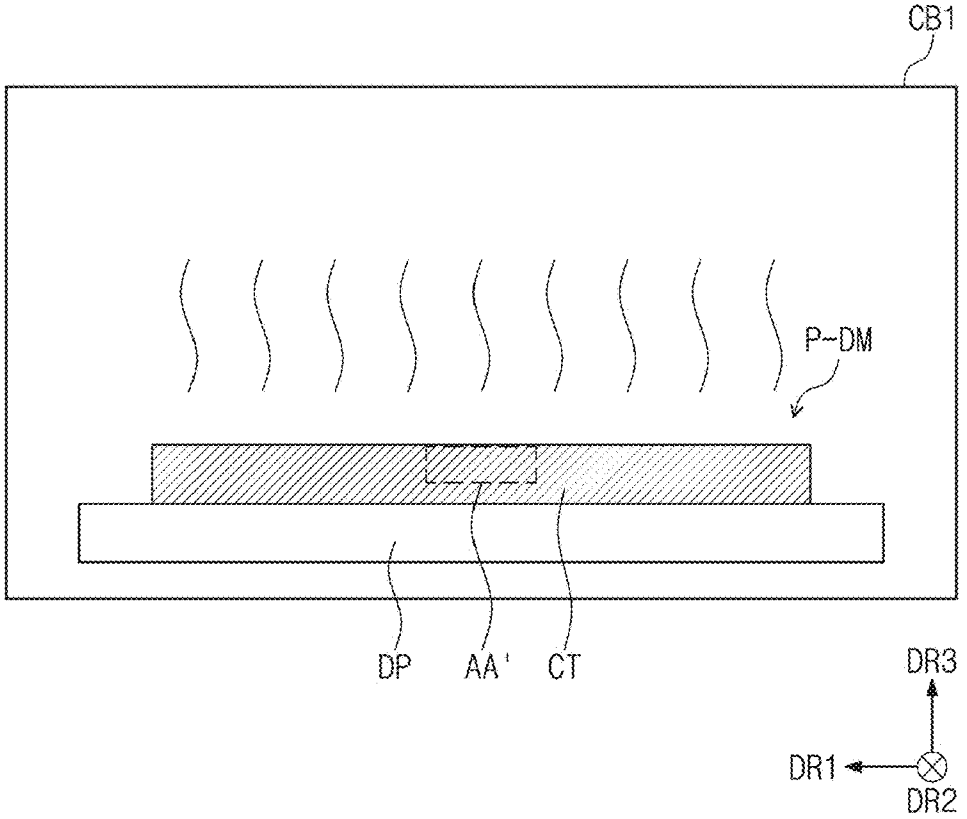
FIG. 7 is a view illustrating a step of forming a preliminary cover panel according to an embodiment of the present disclosure.
Figure 8:
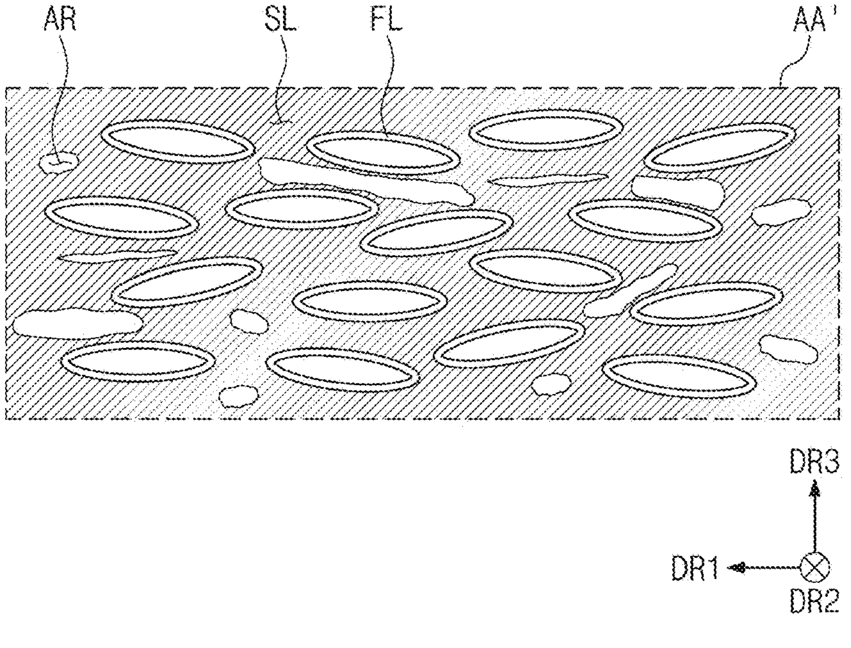
FIG. 8 is an enlarged view of an area AA' of FIG. 7.

FIG. 7 is a view illustrating a steps of forming the preliminary cover panel (S200) according to an embodiment of the present disclosure. FIG. 8 is an enlarged view of an area AA' of FIG. 7.

In the step of forming the preliminary cover panel (S200), placing a preliminary display module P-DM in a first chamber CB1 and heating the preliminary display module P-DM may be performed.

In the present disclosure, the preliminary display module P-DM may refer to the display module P-DM in a state before the cover panel CP (refer to FIG. 10) is formed in the manufacturing process of the display module DM (refer to FIG. 1). The preliminary display module P-DM may include the display panel DP and the coating layer CT disposed on the display panel DP, as depicted in FIG. 7.

Referring to FIGS. 7 and 8, the first chamber CB1 may correspond to a "heating chamber" that heats internal air to heat members placed in an inner accommodation space thereof. The first chamber CB1 may have the accommodation space in which the display panel DP is placed. The first chamber CB1 may heat the preliminary display module P-DM including the display panel DP and the coating layer CT, which are placed therein. FIG. 7 shows the first chamber CB1 having a simplified rectangular shape when viewed in a cross-section, however, the shape of the first chamber CB1 should not be particularly limited as long as the first chamber CB1 accommodates the display panel DP therein and heats the display panel DP. Although not shown in figures, the first chamber CB1 may further include a heating member to heat the inner accommodation space thereof.

The step of forming the preliminary cover panel (S200) may be performed at a first temperature and during a first time period. The first temperature and the first time period may respectively correspond to a temperature and a time to semi-cure the coating layer CT without causing damage to the display panel DP by heating. In an embodiment, the first temperature may be equal to or greater than about 70° C. and equal to or smaller than about 100° C., and the first time period may be equal to or greater than about 10 minutes and equal to or smaller than about 20 minutes.

The coating layer CT may be formed by applying the coating solution RG (refer to FIG. 5). Accordingly, the coating layer CT may include the coating solution RG (refer to FIG. 5) containing the mixed solution SL, which is obtained by mixing the binder, the solvent and the filler FL.

The binder may include one of an epoxy-based binder, a silicon-based binder, a copper, a polymer, a rubber, a styrene-butadiene rubber (SBR), and aluminum.

The solvent may include one of the common organic solvents, such as acetone, methanol, or water. The solvent may help the filler FL to be dispersed within the binder.

The filler FL may be dispersed and presented within the mixed solution SL obtained by mixing the binder and the solvent. The fillers FL may be in contact with each other to form a "thermal and electrical conduction network". In the present disclosure, the "thermal and electrical conduction network" may mean a connection relationship in which the fillers FL are in contact with each other to achieve an efficient thermal and electrical conduction effect. Therefore, the fillers FL may conduct heat emitted from the display panel DP to each other, and the heat dissipation function of the display module DM (refer to FIG. 1) may be improved.

The filler FL may include one of a carbon fiber, a graphite, a carbon black, a metallic filler, or a copper-silver alloy (AgCu). However, the present disclosure should not be limited thereto. According to an embodiment, the cover panel CP (refer to FIG. 10) described later may have various functions such as the light blocking function, the electromagnetic interference blocking function, or the heat dissipation function depending on the type of filler contained in the coating solution RG (refer to FIG. 5).

The filler FL may be dispersed in the mixed solution SL. In the present disclosure, the mixed solution SL may be used as a general term to refer not only to a liquid state but also to a semi-cured state. In FIG. 8, the filler FL is shown as an oval shape, however, the present disclosure should not be limited thereto.

In the coating layer CT, there may be a portion where the mixed solution SL and the filler FL are not distributed. In the present disclosure, the portion in which the mixed solution SL and the filler FL are not distributed may be referred to as a pore AR. The pore AR may correspond to a gap formed by gas generated during the formation of the coating layer CT or introduced from the outside and then trapped inside the coating layer CT. In the present disclosure, the pore AR may also be referred to as a "crack".

Since the coating solution RG (refer to FIG. 5) includes the filler FL having relatively high molecular weight, the coating solution RG (refer to FIG. 5) may have high viscosity. Accordingly, multiple pores ARs having numerous gas trapped inside may be formed inside the coating layer CT (refer to FIG. 7) made from the coating solution RG (refer to FIG. 5). Since the pores AR are naturally generated during the formation process of the coating layer CT (refer to FIG. 7), they may have irregular shapes and positions.

The pores AR may prevent the fillers FL from contacting each other and performing their heat dissipation function. That is, the pores AR may prevent the fillers FL from contacting each other to form the thermal and electrical conduction network.

The possibility of the fillers FL coming into contact with each other may be reduced by the pores AR contained in the coating layer CT. Accordingly, the heat dissipation function of the coating layer CT (refer to FIG. 7) may be diminished.

Since the coating layer CT (refer to FIG. 7) is heated and dried in the step of forming the preliminary cover panel (refer to S200 of FIG. 3), a portion of the solvent contained in the mixed solution SL may be evaporated.

As an amount of the solvent in a total material contained in the coating layer CT (refer to FIG. 7) decreases, a proportion of the filler FL in the total material contained in the coating layer CT (refer to FIG. 7) may increase. Since the filler FL has a larger molecular weight than the solvent, an average molecular weight of the coating layer CT may increase compared to before heating and drying. Accordingly, the viscosity of the coating layer CT (refer to FIG. 7) may increase compared to before heating and drying.

According to the present disclosure, in the step of forming the preliminary cover panel (refer to S200 of FIG. 3), not all solvent contained in the coating layer CT (refer to FIG. 7) is evaporated, but only a portion of the solvent is evaporated. Therefore, the preliminary cover panel P-CP (refer to FIG. 9) having the semi-cured coating layer CT may be formed.

Figure 9:
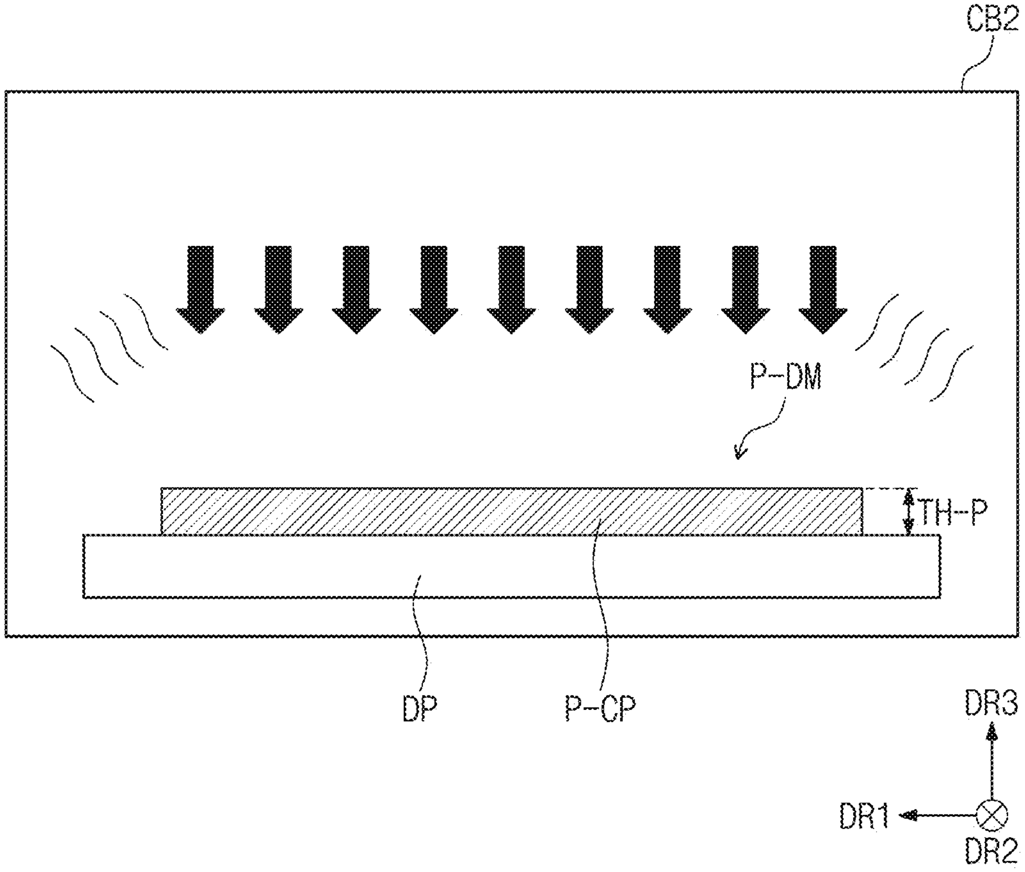
FIG. 9 is a view illustrating a step of forming a cover panel according to an embodiment of the present disclosure.

FIG. 9 is a view illustrating a step of forming the cover panel (refer to S300 of FIG. 3) according to an embodiment of the present disclosure.

Referring to FIG. 9, the forming the cover panel CP (refer to S300 of FIG. 3) may be performed.

The forming the cover panel (refer to S300 of FIG. 3) may include placing the preliminary display module P-DM in a second chamber CB2 and pressing and heating the preliminary display module P-DM placed in the second chamber CB2.

The second chamber CB2 may have an accommodation space in which the preliminary display module P-DM is placed. The second chamber CB2 may be a heating and pressing chamber that heats the preliminary display module P-DM including the display panel DP and the preliminary cover panel P-CP and controls pressure applied to the display panel DP and the preliminary cover panel P-CP, which are accommodated therein. That is, the second chamber CB2 may further have the pressing function compared with the first chamber CB1 (refer to FIG. 7), however, the present disclosure should not be limited thereto. As an example, the second chamber CB2 and the first chamber CB1 (refer to FIG. 7) may be the same heating and pressing chamber, and the step of forming the preliminary cover panel S200 (refer to FIG. 3) only uses the heating function may be used without using the pressing function.

FIG. 9 shows the second chamber CB2 having a simplified rectangular shape when viewed in a cross-section, however, the shape of the first chamber CB1 should not be particularly limited thereto as long as the second chamber CB2 has the heating and pressing functions.

The step of forming the cover panel S300 (refer to FIG. 3) may be performed at a second temperature and during a second time period. As an example, the second temperature may be equal to or greater than about 70° C. and equal to or smaller than about 100° C., and the second time period may be equal to or greater than about 10 minutes and equal to or smaller than about 20 minutes.

In the step of forming the cover panel S300 (refer to FIG. 3), the preliminary cover panel P-CP may be pressed by an internal air pressure of the second chamber CB2. The internal air pressure of the second chamber CB2 may be applied to the preliminary cover panel P-CP as an external force, and thus, one or more of the pores AR (refer to FIG. 8) may be removed or may decrease in size.

However, since the preliminary cover panel P-CP is directly formed on the rear surface BS (refer to FIG. 5) of the display panel DP, cracks may occur in the display panel DP when excessive pressure is applied to the preliminary cover panel P-CP to remove the pores AR (refer to FIG. 8)

of the preliminary cover panel P-CP. Accordingly, the internal air pressure of the second chamber CB2 needs to be adjusted to an appropriate range. As an example, the internal air pressure of the second chamber CB2 may be within a range equal to or greater than about 10 bar and equal to or smaller than about 20 bar.

Figure 10:
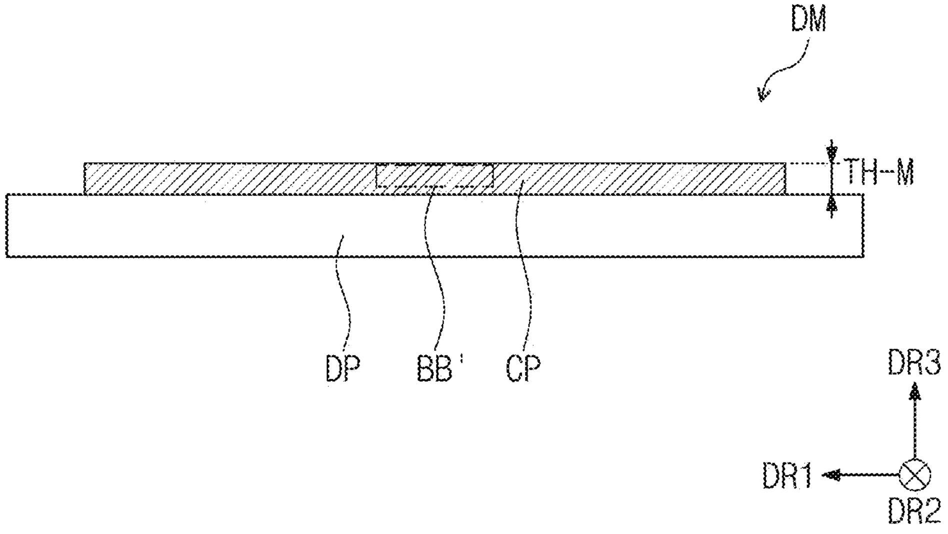
FIG. 10 is a cross-sectional view of a display module manufactured by a manufacturing method of the display module according to an embodiment of the present disclosure.
Figure 11:
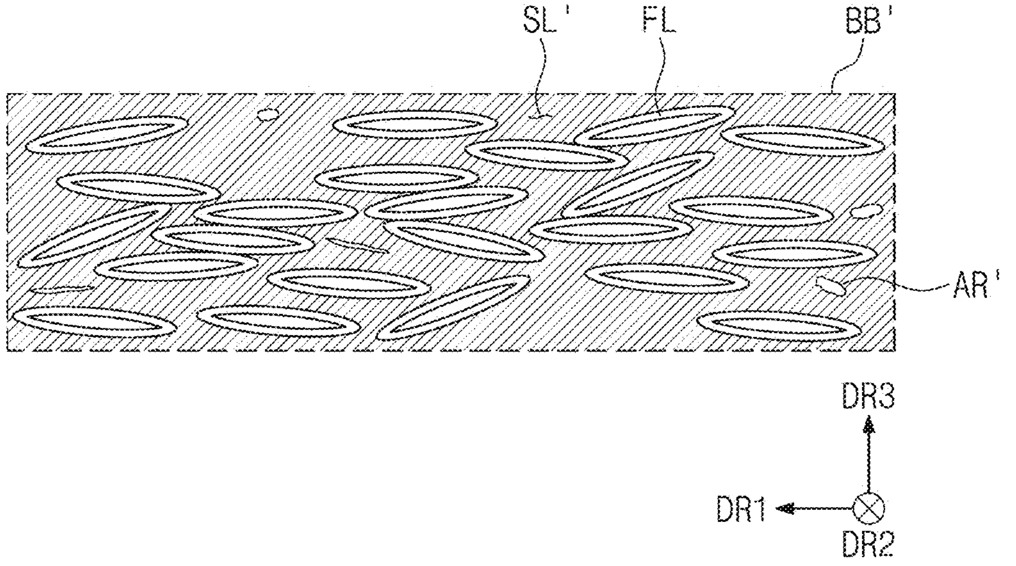
FIG. 11 is an enlarged view of an area BB' of FIG. 10.

FIG. 10 is a cross-sectional view of the display module DM manufactured by the manufacturing method of the display module DM according to an embodiment of the present disclosure. FIG. 11 is an enlarged view of an area BB' of FIG. 10.

The preliminary cover panel P-CP (refer to FIG. 9) may be compressed and dried through the step of forming the cover panel S300 (refer to FIG. 3) to form the cover panel CP. The cover panel CP may be formed when the solvent contained in the preliminary cover panel P-CP is evaporated and dried and a volume of the preliminary cover panel P-CP (refer to FIG. 8) is reduced.

Referring to FIG. 10, the cover panel CP may have a second thickness TH-M. In the present disclosure, the second thickness TH-M of the cover panel CP may be equal to or greater than about 100 μm and equal to or smaller than about 200 um.

The second thickness TH-M of the cover panel CP may be smaller than a first thickness TH-P (refer to FIG. 9) of the preliminary cover panel P-CP (refer to FIG. 9). The cover panel CP may have a density greater than a density of the preliminary cover panel P-CP (refer to FIG. 9). The cover panel CP may have a viscosity greater than a viscosity of the preliminary cover panel P-CP (refer to FIG. 9).

The cover panel CP according to an embodiment may have improved thermal conductivity compared to a cover panel used in a conventional display module. That is, the cover panel CP according to the present disclosure may have improved heat dissipation function. As an example, the cover panel CP according to the present disclosure may have a horizontal thermal conductivity equal to or greater than about 70 W/mK and equal to or smaller than about 130 W/mK.

Referring to FIG. 11, pores AR' in the cover panel CP may correspond to remaining pores AR (refer to FIG. 8) after at least a portion thereof existed in the coating layer CT (refer to FIG. 7) is removed. That is, the number of the pores AR' per unit area may be less than the number of the pores AR (refer to FIG. 8) per unit area. In addition, a size of the pores AR' of the cover panel CP may be smaller than a size of the pores AR (refer to FIG. 8) of the coating layer CT (refer to FIG. 7).

Accordingly, a frequency at which the pores AR' interfere with the contact between the fillers FL may be reduced. Thus, the contact frequency between the fillers FL may increase, and the thermal and electrical conduction network of the fillers FL may be improved. Therefore, the cover panel CP may have improved thermal and electrical conductivity.

Figure 12A:
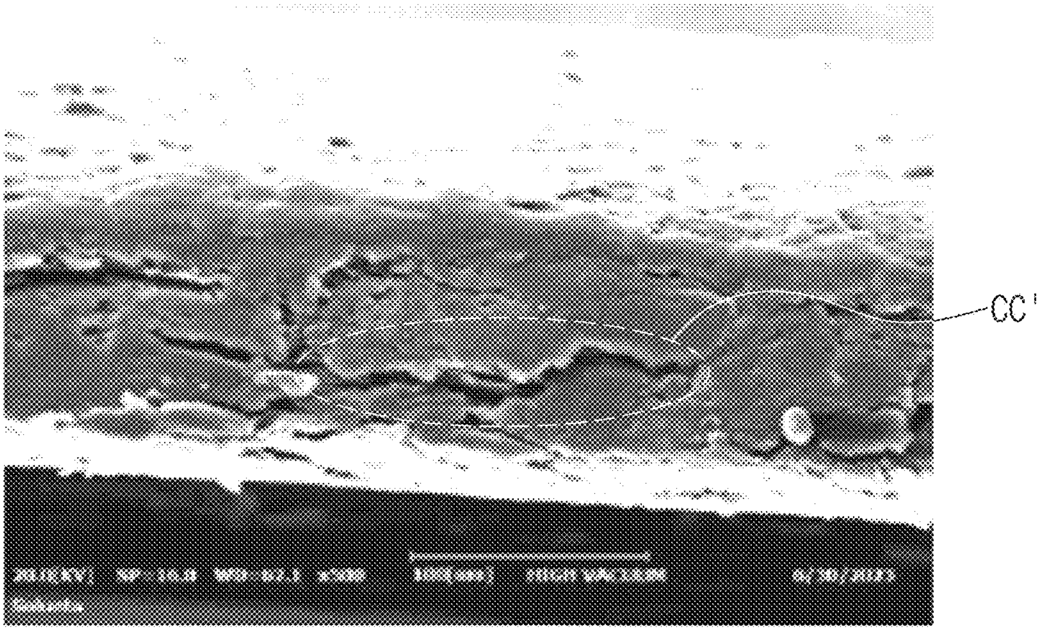
FIG. 12A is an SEM image illustrating a cross-section of a preliminary cover panel according to an embodiment of the present disclosure.
Figure 12B:
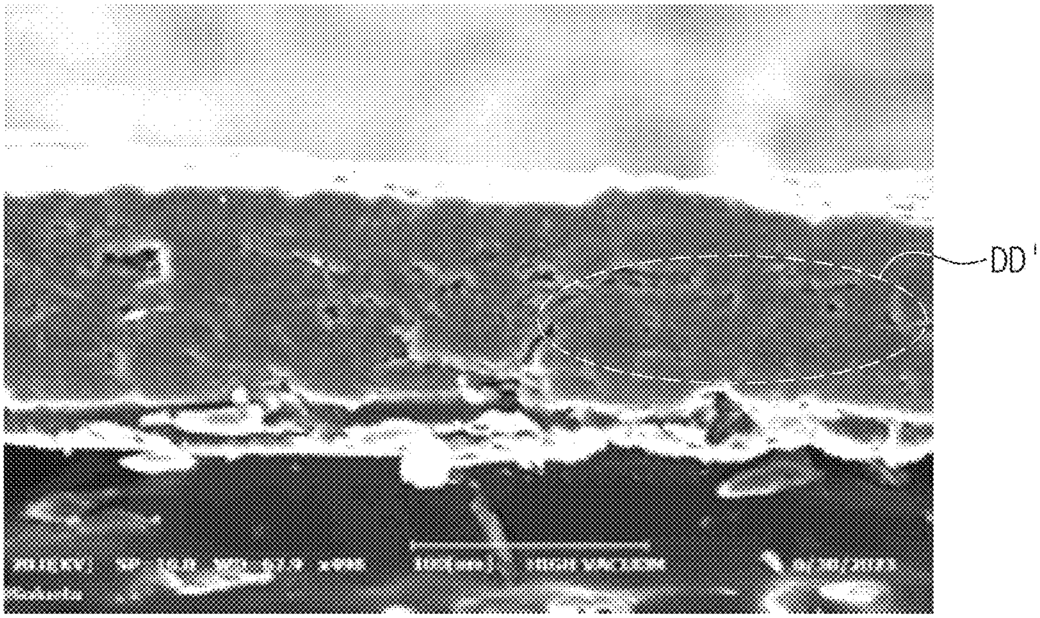
FIG. 12B is an SEM image illustrating a cross-section of a cover panel according to an embodiment of the present disclosure.

FIG. 12A is an SEM image illustrating a cross-section of the preliminary cover panel according to an embodiment of the present disclosure, and FIG. 12B is an SEM image illustrating a cross-section of the cover panel according to an embodiment of the present disclosure.

FIG. 12A is the SEM image obtained, using a scanning electron microscope (SEM), by taking a picture of the cross-section of the preliminary cover panel on which only the coating solution is applied (refer to S100 of FIG. 3) and the preliminary cover panel is formed (refer to S200 of FIG. 3) according to the manufacturing method of the display module are performed. FIG. 12B is the SEM image obtained by taking a picture of the cross-section of the cover panel on which the step of forming the cover panel (refer to S300 of FIG. 3) is further performed using the scanning electron microscope (SEM).

Referring to FIGS. 12A and 12B, it is observed that many pores are formed inside the preliminary cover panel on which only a semi-drying process was performed. On the other hand, it is observed that many of the pores are removed or reduced in size when a high temperature and pressure treatment is performed after the semi-drying process.

In addition, when comparing an area CC' shown in FIG. 12A with an area DD' shown in FIG. 12B, it is observed that the packing density of the cover panel, even when seen with the naked eye, is significantly increased compared to the preliminary cover panel.

When the coating solution RG (refer to FIG. 5) is applied to a separate film rather than the display panel to form a cover panel sheet and the cover panel sheet is attached to the rear surface of the display panel, an overall thermal conductivity of the display module may increase. As an example, according to comparative examples, when the coating solution RG (refer to FIG. 5) is applied to a release film and processed for about 20 minutes at a high temperature of about 150° C. and an ultra-high pressure of about 70 bar, it is observed that the thermal conductivity may be improved in a range of about 1.5 to about 2 times.

However, since the directed-coated cover panel (DCCP) is formed by forming the cover panel directly on the rear surface BS (refer to FIG. 5) of the display panel DP (refer to FIG. 5), the high temperature and high pressure processes for the cover panel CP (refer to FIG. 10) may cause damage to the display panel DP (refer to FIG. 5). As an example, cracks may be generated in the encapsulation layer or the base layer included in the display panel DP (refer to FIG. 5).

According to the manufacturing method of the display module of the present disclosure, as the semi-curing process of the coating layer is performed at a temperature within the range that does not cause damage to the display panel DP (refer to FIG. 5) as the first forming process and the preliminary cover panel obtained by the semi-curing process of the coating layer is processed under the high temperature and high pressure condition as the second forming process, the pores in the coating layer may be efficiently removed. That is, the packing density of the cover panel may be improved by removing the pores in the coating layer at a relatively low temperature and pressure range. Accordingly, the thermal and electrical conductivity of the display module may be improved without causing cracks to the display panel DP (refer to FIG. 5).

In addition, according to an embodiment of the manufacturing method of the display module, as the first forming process (refer to S200 of FIG. 3) is performed before the second forming process (refer to S300 of FIG. 3), the coating layer CT (refer to FIG. 7) may be prevented from being deformed.

When the first forming process (refer to S200 of FIG. 3) is omitted and only the second forming process (refer to S300 of FIG. 3) is performed, the shape of the coating layer CT (refer to FIG. 7) with low viscosity may be easily deformed. That is, according to the manufacturing method of the display module of the present disclosure, since the pressing process is performed after the semi-curing process of the coating layer CT (refer to FIG. 7) through the first forming process (refer to S200 of FIG. 3) to secure a certain hardness, the reliability of the cover panel CP (refer to FIG. 10) of the display module DM (refer to FIG. 10) may be improved.

In addition, according to the manufacturing method of the display module of the present disclosure, since the cover panel CP (refer to FIG. 10) having the single-layer structure is directly formed on the display panel DP (refer to FIG. 5), the manufacturing method of the display module may be simplified compared with the conventional manufacturing method of the display module including the cover panel having the multi-layer structure.

Figure 13:
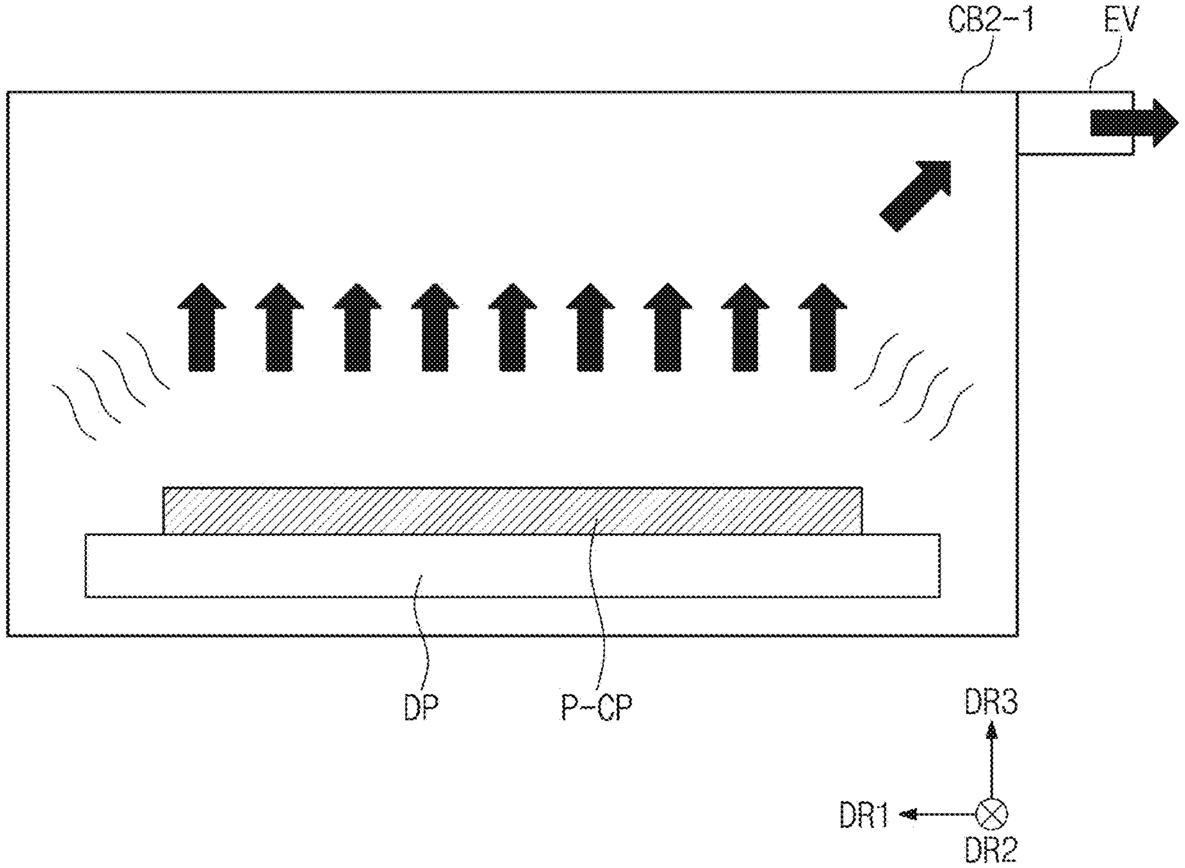
FIG. 13 is a step illustrating a method of manufacturing a display module according to an embodiment of the present disclosure.

FIG. 13 is a view illustrating a method of manufacturing a display module according to an embodiment of the present disclosure.

The manufacturing method of the display module may include applying a coating solution to a rear surface of a display panel using a screen printing process, semi-curing the coating solution at a first temperature to form a preliminary cover panel on the rear surface of the display panel, and decompressing the preliminary cover panel at a second temperature to form a cover panel.

In FIG. 13, the same or similar reference numerals denote the same or similar elements in FIGS. 1 to 12A, and thus, detailed descriptions of the same elements will be omitted.

Referring to FIG. 13, the forming the cover panel may include placing the display panel DP and the preliminary cover panel P-CP disposed on the rear surface of the display panel DP in a second chamber CB2-1 and heating the preliminary cover panel P-CP at the second temperature to provide a decompression state.

In the present embodiment, the second chamber CB2-1 may be a heating and decompressing chamber. The second chamber CB2-1 may further include a decompression device EV that discharges air in the second chamber CB2-1 to the outside to reduce the internal pressure. Accordingly, the inside of the second chamber CB2-1 may correspond to an open system.

In the present disclosure, the term "decompressing" means providing a pressure lower than atmospheric pressure. As an example, the inside of the second chamber CB2-1 may be maintained in a vacuum state.

Therefore, gases inside pores of the preliminary display panel P-CP may be expelled to the outside. FIG. 13 illustrates that the gases inside the second chamber CB2-1 and inside the pores are discharged to the outside through the decompression device EV.

Since many of the pores of the preliminary display panel P-CP are removed after the steps described above with reference to FIG. 13 are performed, a packing density of the preliminary cover panel P-CP may increase. Accordingly, the thermal and electrical conductivity of the display module manufactured by the manufacturing method of the display module according to an embodiment may be improved.

In addition, since the cover panel is formed to have a single-layer structure, the manufacturing method of the display module may be simplified compared to the conventional display module including the cover panel formed in the multi-layer structure.

Although the present disclosure has been described with reference to embodiments thereof, it is understood that the present disclosure should not be limited to these embodiments but various changes and modifications can be made by one ordinary skilled in the art within the spirit and scope of the present disclosure as set forth in the following claims. Therefore, the disclosed subject matter should not be limited to any single embodiment described herein, and the scope of the present inventive concept shall be determined according to the attached claims.

What is claimed is:

1. A method of manufacturing a display module, comprising:

applying a coating solution to a rear surface of a display panel using a screen printing process;

semi-curing the coating solution at a first temperature to form a preliminary cover panel; and pressing the preliminary cover panel at a second temperature to form a cover panel.

2. The method of claim 1, wherein the first temperature is equal to or greater than about 70° C. and equal to or smaller than about 100° C., and the second temperature is equal to or greater than about 70° C. and equal to or smaller than about 100° C., and wherein a number of pores in the preliminary cover panel is greater than a number of pores in the cover panel.

3. The method of claim 1, wherein a time for forming the preliminary cover panel is equal to or greater than about 10 minutes and equal to or smaller than about 20 minutes, and a time for forming the cover panel is equal to or greater than about 10 minutes and equal to or smaller than about 20 minutes.

4. The method of claim 1, wherein the display panel comprises a display area and a non-display area adjacent to the display area, and the coating solution is disposed on an entire area of the rear surface of the display panel overlapping the display area and a portion of the rear surface of the display panel overlapping the non-display area.

5. The method of claim 1, wherein the cover panel has a thickness equal to or greater than about 100 micrometers and equal to or smaller than about 200 micrometers.

6. The method of claim 1, wherein the cover panel has a horizontal thermal conductivity equal to or greater than about 70 W/mK and equal to or smaller than about 130 W/mK.

7. The method of claim 1, wherein a pressure applied to the preliminary cover panel during the forming of the cover panel is equal to or greater than about 10 bar and equal to or smaller than about 20 bar.

8. The method of claim 1, wherein the screen printing process comprises placing a mesh mask or a metal open mask.

9. The method of claim 1, wherein the coating solution has a viscosity equal to or greater than about 100 cps and equal to or smaller than about 900 cps.

10. The method of claim 1, wherein the coating solution comprises a binder, a filler mixed with and dispersed in the binder, and a solvent, and a portion of the solvent of the coating solution is evaporated during the forming of the preliminary cover panel.

11. The method of claim 10, wherein the binder comprises an epoxy resin in a liquid state or a silicon resin in a liquid state, and the filler comprises a graphite filler or a metallic filler.

12. The method of claim 1, wherein the cover panel has a single-layer structure and is in direct contact with the rear surface of the display panel.

13. The method of claim 1, wherein the cover panel has a thickness smaller than a thickness of the preliminary cover panel, the cover panel has a density greater than a density of the preliminary cover panel, and the cover panel has a viscosity greater than a viscosity of the preliminary cover panel.

14. The method of claim 1, wherein forming the preliminary cover panel comprises placing the display panel on which the coating solution is applied inside a first chamber, and forming the cover panel comprises placing the display panel on which the preliminary cover panel is formed inside a second chamber.

15. The method of claim 1, wherein non-uniform pores are formed in the preliminary cover panel during the forming of the preliminary cover panel.

16. The method of claim 15, wherein at least one of the non-uniform pores is removed during the forming of the cover panel.

17. A method of manufacturing a display module, comprising:

applying a coating solution to a rear surface of a display panel using a screen printing process;

semi-curing the coating solution at a first temperature to form a preliminary cover panel on the rear surface of the display panel; and decompressing the preliminary cover panel at a second temperature to form a cover panel.

18. The method of claim 17, wherein the first temperature is equal to or greater than about 70° C. and equal to or smaller than about 100° C., the second temperature is equal to or greater than about 70° C. and equal to or smaller than about 100° C., and the decompressed state is a vacuum state, and wherein a number of pores in the preliminary cover panel is greater than a number of pores in the cover panel.

19. The method of claim 17, wherein a time for forming the preliminary cover panel is equal to or greater than about 10 minutes and equal to or smaller than about 20 minutes, and a time for forming of the cover panel is equal to or greater than about 10 minutes and equal to or smaller than about 20 minutes.

20. The method of claim 17, wherein forming the cover panel comprises:

placing the display panel on which the preliminary cover panel is disposed inside a decompression chamber; and discharging an air in the decompression chamber to an outside of the decompression chamber to maintain the decompression state.

* * * * *